United States Patent
Masuda et al.

(10) Patent No.: US 9,274,273 B2
(45) Date of Patent: Mar. 1, 2016

(54) OPTO-ELECTRIC HYBRID BOARD

(71) Applicant: NITTO DENKO CORPORATION, Ibaraki-shi, Osaka (JP)

(72) Inventors: Shotaro Masuda, Ibaraki (JP); Toshikazu Baba, Ibaraki (JP); Yasuto Ishimaru, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 109 days.

(21) Appl. No.: 13/951,633

(22) Filed: Jul. 26, 2013

(65) Prior Publication Data

US 2014/0126857 A1    May 8, 2014

(30) Foreign Application Priority Data

Nov. 8, 2012    (JP) ................. 2012-246593

(51) Int. Cl.
G02B 6/12 (2006.01)
H05K 1/02 (2006.01)
G02B 6/138 (2006.01)

(52) U.S. Cl.
CPC ............ *G02B 6/12002* (2013.01); *G02B 6/138* (2013.01); *H05K 1/028* (2013.01); *H05K 1/0274* (2013.01); *H05K 2201/09236* (2013.01); *H05K 2201/09909* (2013.01); *H05K 2201/09972* (2013.01); *H05K 2203/1572* (2013.01)

(58) Field of Classification Search
CPC ................ G02B 6/12002; G02B 6/12; G02B 2006/12085; G02B 6/138; H05K 1/0274; H05K 1/0277
See application file for complete search history.

(56) References Cited

U.S. PATENT DOCUMENTS

| | | | |
|---|---|---|---|
| 7,831,116 B2 * | 11/2010 | Kim et al. ................. 385/14 |
| 7,899,278 B2 * | 3/2011 | Pitwon ..................... 385/14 |
| 8,244,080 B2 * | 8/2012 | Shibata et al. ............. 385/14 |
| 2009/0130390 A1 * | 5/2009 | Kim et al. ................. 428/172 |
| 2009/0285524 A1 | 11/2009 | Ishii et al. |
| 2010/0002985 A1 | 1/2010 | Ishii et al. |
| 2010/0002986 A1 | 1/2010 | Naito et al. |
| 2010/0129045 A1 * | 5/2010 | Shibata et al. ............. 385/141 |

(Continued)

FOREIGN PATENT DOCUMENTS

WO    2010/058476 A1    5/2010

OTHER PUBLICATIONS

Extended European Search Report dated Feb. 4, 2014, issued in European Patent Application No. 13179698.9, (6 pages).

*Primary Examiner* — Rhonda Peace
(74) *Attorney, Agent, or Firm* — Westerman, Hattori, Daniels & Adrian, LLP

(57) ABSTRACT

An opto-electric hybrid board which is capable of significantly reducing stresses applied to a bent portion thereof is provided. The opto-electric hybrid board includes a stacked electric circuit board and an optical waveguide. The electric circuit board includes an insulative layer having front and back surfaces, electrical interconnect lines formed on the front surface of the insulative layer, and an insulative coverlay formed on the front surface of the insulative layer and for covering and protecting the electrical interconnect lines. The optical waveguide includes a first cladding layer having a front surface, cores formed in a pattern on the front surface of the first cladding layer, and a second cladding layer covering the cores. Part of the opto-electric hybrid board is defined as a to-be-bent portion in which the coverlay and the optical waveguide are disposed in non-overlapping relation.

4 Claims, 6 Drawing Sheets

(56) References Cited

U.S. PATENT DOCUMENTS

| | | | |
|---|---|---|---|
| 2010/0316330 A1* | 12/2010 | Kim et al. | 385/14 |
| 2011/0274389 A1 | 11/2011 | Kuroda et al. | |
| 2012/0236579 A1* | 9/2012 | Uemura et al. | 362/382 |
| 2013/0243370 A1* | 9/2013 | Tsujita et al. | 385/14 |
| 2013/0315546 A1* | 11/2013 | Wu | 385/129 |
| 2014/0004321 A1* | 1/2014 | Kondo et al. | 428/195.1 |
| 2014/0126857 A1* | 5/2014 | Masuda et al. | 385/14 |

\* cited by examiner

RELATED ART

OPTO-ELECTRIC HYBRID BOARD

BACKGROUND OF THE INVENTION

1. Field of the Invention

The present invention relates to an opto-electric hybrid board including an electric circuit board and an optical waveguide which are stacked together.

2. Description of the Related Art

With the increase in the amount of transmission information, optical interconnection in addition to electrical interconnection has been used in recent electronic devices and the like. As an example of such a technique, an opto-electric hybrid board as shown in FIG. 7 has been proposed (as disclosed in International Publication No. WO 2010/058476, for example). This opto-electric hybrid board includes: an electric circuit board $E_0$ including an insulative flexible substrate (insulative layer) 51, electrical interconnect lines 52 formed on the front surface of the flexible substrate 51, and an insulative coverlay (interconnect line cover layer) 53 formed on the front surface of the flexible substrate 51 and for covering and protecting the electrical interconnect lines 52; and an optical waveguide (an optical interconnect line) $W_0$ (including an under cladding layer 56, cores 57 and an over cladding layer 58) made of epoxy resin and the like and stacked on the back surface (a surface opposite from the surface with the electrical interconnect lines 52 formed thereon) of the flexible substrate 51 of the electric circuit board $E_0$. Both of the electric circuit board $E_0$ and the optical waveguide $W_0$ in the opto-electric hybrid board are thin and accordingly flexible. To meet the requirement for the size reduction of recent electronic devices and the like, the opto-electric hybrid board has been used in a small space when in a bent position, and used in a movable section such as a hinge.

In the aforementioned opto-electric hybrid board, the coverlay 53 which covers and protects the electrical interconnect lines 52 and the optical waveguide $W_0$ are in general disposed in stacked relation (in vertically stacked relation as seen in FIG. 7). Thus, the thickness of the aforementioned opto-electric hybrid board is the sum of the thickness of the electric circuit board $E_0$ and the thickness of the optical waveguide $W_0$. When such an opto-electric hybrid board is bent, stresses are applied to the bent portion of the opto-electric hybrid board due to the thickness thereof. As a result, there is a danger that a break or a crack occurs in the bent portion to impair the achievement of proper information transmission.

SUMMARY OF THE INVENTION

An opto-electric hybrid board is provided which is capable of significantly reducing stresses applied to a bent portion thereof.

The opto-electric hybrid board comprises: an electric circuit board including an insulative layer having front and back surfaces, electrical interconnect lines formed on the front surface of the insulative layer, and an insulative interconnect line cover layer formed on the front surface of the insulative layer and for covering and protecting the electrical interconnect lines; and an optical waveguide including a cladding layer having a front surface, and cores formed in a pattern on the front surface of the cladding layer, the electric circuit board and the optical waveguide being stacked together, with the cladding layer in contact with the back surface of the insulative layer, part of the opto-electric hybrid board being defined as a to-be-bent portion in which the interconnect line cover layer and the optical waveguide are disposed in non-overlapping relation.

In the to-be-bent portion of the opto-electric hybrid board, the interconnect line cover layer and the optical waveguide are disposed in non-overlapping relation. Thus, the thickness of the to-be-bent portion of the opto-electric hybrid board is less than the sum of the thickness of the electric circuit board and the thickness of the optical waveguide. When the opto-electric hybrid board is bent in the to-be-bent portion, stresses applied to the bent portion are significantly reduced. Breaks and cracks are prevented from occurring in the bent portion. This achieves proper information transmission.

Preferably, $T_A$ which is the thickness of a bent portion of the opto-electric hybrid board when in a bent position to $T_E$ which is the thickness of the electric circuit board and $T_W$ which is the thickness of the optical waveguide satisfies the following condition (1). In such a case, stresses applied to the bent portion are significantly reduced. Breaks and cracks are prevented from occurring in the bent portion. This achieves proper information transmission.

$$T_A < T_E + T_W \tag{1}$$

DETAILED DESCRIPTION OF THE INVENTION

Preferred embodiments according to the present invention will now be described in detail with reference to the drawings.

Figure 1:
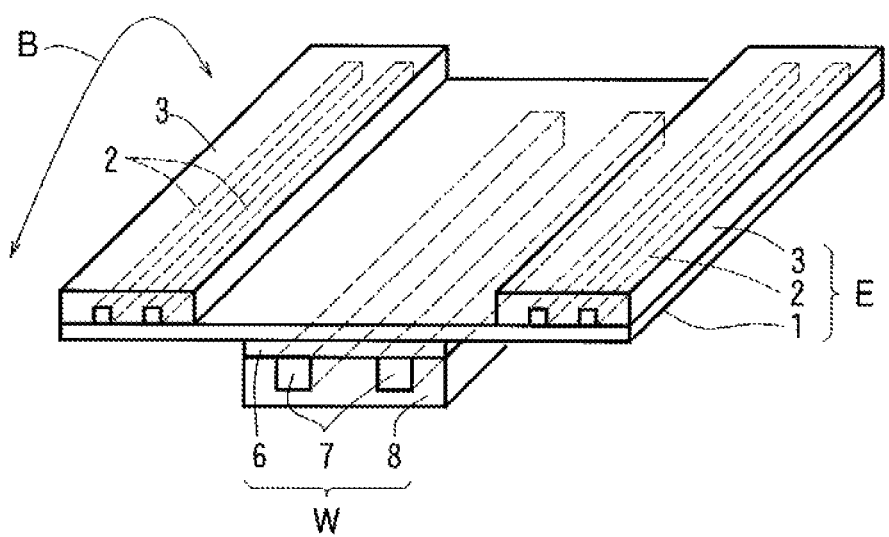
FIG. 1 is a perspective view schematically showing an opto-electric hybrid board according to a first preferred embodiment.

FIG. 1 is a perspective view schematically showing an opto-electric hybrid board according to a first preferred embodiment. The opto-electric hybrid board according to the first preferred embodiment is strip-shaped, and includes an electric circuit board E and an optical waveguide W. In the electric circuit board E, electrical interconnect lines 2 and insulative coverlays (interconnect line cover layers) 3 for covering and protecting the electrical interconnect lines 2 are formed on the front surface side (top as seen in FIG. 1) of laterally opposite side portions of the opto-electric hybrid board and extend in the longitudinal direction of the opto-electric hybrid board. The optical waveguide W is formed on the back surface side (bottom as seen in FIG. 1) of a laterally middle portion of the opto-electric hybrid board. In the first preferred embodiment, the coverlays 3 and the optical waveguide W are disposed in non-overlapping relation throughout the longitudinal direction of the strip-shaped opto-electric hybrid board.

More specifically, the electric circuit board E includes a strip-shaped insulative layer 1, the electrical interconnect lines 2 formed on the front surface of laterally opposite side portions of the insulative layer 1 and extending in the longitudinal direction thereof, and the coverlays 3 formed on the front surface of the laterally opposite side portions of the insulative layer 1 and for providing insulative protection to the electrical interconnect lines 2.

The optical waveguide W includes a first cladding layer (under cladding layer) 6, cores 7 formed in a predetermined pattern on the front surface of the first cladding layer 6, and a second cladding layer (over cladding layer) 8 formed on the front surface of the first cladding layer 6 so as to cover the cores 7. The first cladding layer 6 has a back surface (a surface opposite from the surface with the cores 7 formed thereon) in contact with the insulative layer 1 of the electric circuit board E.

Specifically, the coverlays 3 and the optical waveguide W are disposed in non-overlapping relation throughout the longitudinal direction of the aforementioned strip-shaped opto-electric hybrid board. Thus, when the strip-shaped opto-electric hybrid board is bent at any location as seen in the longitudinal direction (bent in the direction of the arrow B shown), the thickness ($T_A$) of the bent portion of the opto-electric hybrid board is equal to the thickness ($T_E$) of the electric circuit board E or equal to the sum of the thickness ($T_W$) of the optical waveguide W and the thickness of the insulative layer 1. The thickness ($T_A$) of the bent portion of the opto-electric hybrid board is less than the sum ($T_E+T_W$) of the thicknesses of the electric circuit board E and the optical waveguide W. Stresses applied to the aforementioned bent portion are accordingly small. For this reason, breaks and cracks are prevented from occurring in the bent portion. This allows the electric circuit board E and the optical waveguide W to achieve proper information transmission.

Next, a method of manufacturing the opto-electric hybrid board will be described (with reference to FIGS. 2A to 2E).

First, the insulative layer 1 (with reference to FIG. 2A) is prepared. An example of the insulative layer 1 used herein is a resin sheet, and an example of the material for the formation of the insulative layer 1 is preferably polyimide from the viewpoint of bendability. From the viewpoint of bendability, the insulative layer 1 is preferably thin, and preferably has a thickness of not greater than 100 μm, more preferably not greater than 20 μm. For optical communications between the electric circuit board E and the optical waveguide W, it is preferable that the insulative layer 1 is high in transparency to light.

Figure 2A:
FIGS. 2A to 2E are illustrations schematically showing a method of manufacturing the opto-electric hybrid board.

Next, as shown in FIG. 2A, the electrical interconnect lines 2 are formed on the front surface of the laterally opposite side portions of the insulative layer 1 by a semi-additive process, for example. The semi-additive process is as follows. First, a metal film (not shown) made of copper, chromium and the like is formed on the front surface of the insulative layer 1 by sputtering, electroless plating or the like. This metal film serves as a seed layer (a layer serving as a basis material for the formation of an electroplated layer) for a subsequent electroplating process. Then, a photosensitive resist (not shown) is laminated to the opposite surfaces of a laminate comprised of the insulative layer 1 and the seed layer. Thereafter, a photolithographic process is performed to form holes having the pattern of the electrical interconnect lines 2 in the photosensitive resist on the side where the seed layer is formed, so that surface portions of the seed layer are uncovered at the bottoms of the holes. Next, electroplating is performed to form an electroplated layer made of copper and the like in a stacked manner on the surface portions of the seed layer uncovered at the bottoms of the holes. Then, the photosensitive resist is stripped away using an aqueous sodium hydroxide solution and the like. Thereafter, a portion of the seed layer on which the electroplated layer is not formed is removed by soft etching. Laminate portions comprised of the remaining seed layer and the electroplated layer are the electrical interconnect lines 2. From the viewpoint of bendability, the electrical interconnect lines 2 are preferably thin, and preferably have a thickness of not greater than 100 μm, more preferably not greater than 20 μm. It should be noted that the electrical interconnect lines 2 may be formed by an additive process, a subtractive process and the like in addition to the semi-additive process.

Figure 2B:

Next, as shown in FIG. 2B, a photosensitive insulating resin including a polyimide resin and the like is applied onto the electrical interconnect lines 2 to thereby form the coverlays 3 by a photolithographic process. From the viewpoint of bendability, the coverlays 3 are preferably thinner, and preferably have a thickness (as measured from the front surface of the insulative layer 1) of not greater than 200 μm, more preferably not greater than 50 μm. In this manner, the electric circuit board E is formed.

Figure 2C:
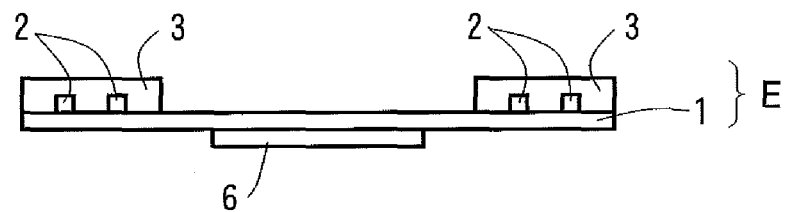

For the formation of the optical waveguide W (with reference to FIG. 2E) on the back surface (the lower surface as seen in the figure) of the insulative layer 1 of the electric circuit board E, a photosensitive resin such as a photosensitive epoxy resin which is a material for the formation of the first cladding layer (under cladding layer) 6 is applied to the back surface of the insulative layer 1, as shown in FIG. 2C. Thereafter, a laterally middle portion of the applied layer is exposed to irradiation light. This exposure cures the laterally middle portion of the applied layer to form the first cladding layer 6. From the viewpoint of bendability, the first cladding layer 6 is preferably thin, and preferably has a thickness of not greater than 80 μm, more preferably not greater than 40 μm. It should be noted that the back surface of the insulative layer 1 is positioned to face upward when the optical waveguide W is formed (when the aforementioned first cladding layer 6, the cores 7 to be described later and the second cladding layer (over cladding layer) 8 to be described later are formed).

Figure 2D:
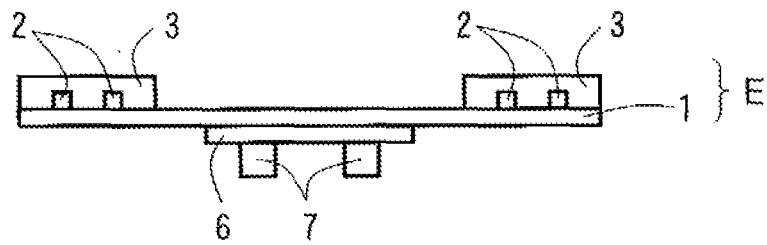

Then, as shown in FIG. 2D, the cores 7 having a predetermined pattern are formed on the front surface (the lower surface as seen in the figure) of the first cladding layer 6 by a photolithographic process. From the viewpoint of decreasing optical losses, the cores 7 are preferably thick, and preferably have a thickness of not less than 5 μm, more preferably not less than 20 μm. From the viewpoint of bendability, the cores 7 are preferably thin, and preferably have a thickness of not greater than 400 μm, more preferably not greater than 100 μm.

An example of a material for the formation of the cores 7 includes a photosensitive resin similar to that for the first cladding layer 6, and the material used herein has a refractive index higher than that of the material for the formation of the aforementioned first cladding layer 6 and the second cladding layer 8 to be described below (with reference to FIG. 2E), with the cores 7 formed. The adjustment of the refractive index may be made, for example, by adjusting the selection of the types of the materials for the formation of the first cladding layer 6, the cores 7 and the second cladding layer 8, and the composition ratio thereof.

Figure 2E:
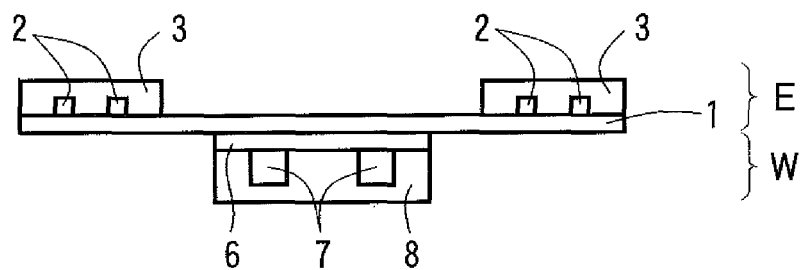

Next, as shown in FIG. 2E, the second cladding layer 8 is formed on the front surface (the lower surface as seen in the figure) of the first cladding layer 6 by a photolithographic process so as to cover the cores 7. From the viewpoint of bendability, the second cladding layer 8 is preferably thin, and preferably has a thickness (as measured from the cores 7) of not greater than 200 μm, more preferably not greater than 100 μm. An example of the material for the formation of the second cladding layer 8 includes a photosensitive resin similar to that for the first cladding layer 6. In this manner, the optical waveguide W is formed on the back surface of the insulative layer 1. This provides an intended opto-electric hybrid board.

Figure 3:
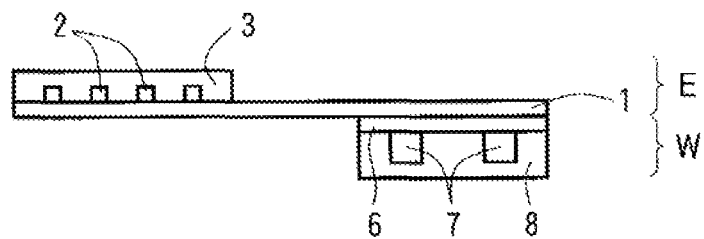
FIG. 3 is a front view schematically showing an opto-electric hybrid board according to a second preferred embodiment.

FIG. 3 is a front view schematically showing an opto-electric hybrid board according to a second preferred embodiment. In the opto-electric hybrid board according to the second preferred embodiment, the electrical interconnect lines 2 and a coverlay 3 are formed on the front surface side (top as seen in FIG. 3) of one of the laterally opposite side portions (a left-hand portion as seen in FIG. 3) of the opto-electric hybrid board, and the optical waveguide W is formed on the back surface side (bottom as seen in FIG. 3) of the other of the laterally opposite side portions (a right-hand portion as seen in FIG. 3) of the opto-electric hybrid board. The second preferred embodiment has functions and effects similar to those of the first preferred embodiment described above.

Figure 4:
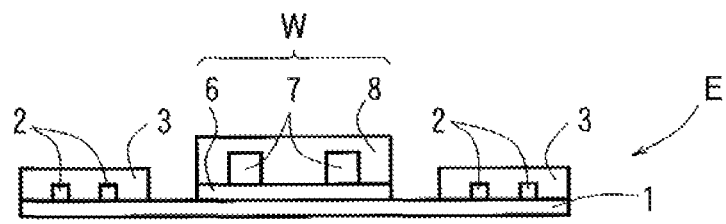
FIG. 4 is a front view schematically showing an opto-electric hybrid board according to a third preferred embodiment.

FIG. 4 is a front view schematically showing an opto-electric hybrid board according to a third preferred embodiment. In the opto-electric hybrid board according to the third preferred embodiment, the electrical interconnect lines 2 and the coverlays 3 are formed on the front surface side (top as seen in FIG. 4) of the laterally opposite side portions of the opto-electric hybrid board, and the optical waveguide W is formed on the front surface side (top as seen in FIG. 4) of the laterally middle portion of the opto-electric hybrid board. In other words, the optical waveguide W is formed on the surface of the insulative layer 1 where the electrical interconnect lines 2 and the coverlays 3 are formed in the first preferred embodiment shown in FIG. 1. The third preferred embodiment has functions and effects similar to those of the first preferred embodiment described above. In addition, the third preferred embodiment achieves the reduction in the entire thickness of the opto-electric hybrid board. This enables the opto-electric hybrid board to be used in a smaller space.

Figure 5:
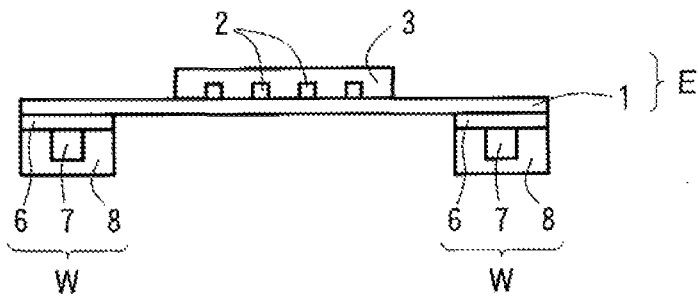
FIG. 5 is a front view schematically showing an opto-electric hybrid board according to a fourth preferred embodiment.

FIG. 5 is a front view schematically showing an opto-electric hybrid board according to a fourth preferred embodiment. In the opto-electric hybrid board according to the fourth preferred embodiment, the electrical interconnect lines 2 and the coverlay 3 are formed on the front surface side (top as seen in FIG. 5) of the laterally middle portion of the opto-electric hybrid board, and the optical waveguide W is formed on the back surface side (bottom as seen in FIG. 5) of each of the laterally opposite side portions of the opto-electric hybrid board. The fourth preferred embodiment has functions and effects similar to those of the first preferred embodiment described above.

Figure 6:
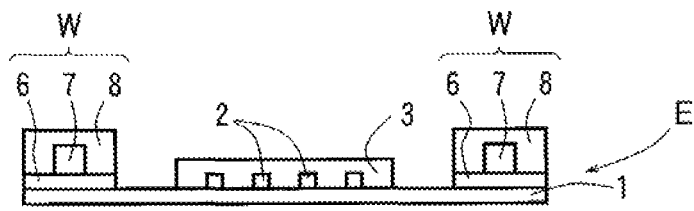
FIG. 6 is a front view schematically showing an opto-electric hybrid board according to a fifth preferred embodiment.

FIG. 6 is a front view schematically showing an opto-electric hybrid board according to a fifth preferred embodiment. In the opto-electric hybrid board according to the fifth preferred embodiment, the electrical interconnect lines 2 and the coverlay 3 are formed on the front surface side (top as seen in FIG. 6) of the laterally middle portion of the opto-electric hybrid board, and the optical waveguide W is formed on the front surface side (top as seen in FIG. 6) of each of the laterally opposite side portions of the opto-electric hybrid board. The fifth preferred embodiment has functions and effects similar to those of the third preferred embodiment described above.

In the aforementioned preferred embodiments, the coverlay (s) 3 and the optical waveguide (s) W are disposed in non-overlapping relation throughout the longitudinal direction of the strip-shaped opto-electric hybrid board. However, the coverlay(s) 3 and the optical waveguide(s) W may be disposed in non-overlapping relation as mentioned above only in a to-be-bent portion of the opto-electric hybrid board, and disposed in overlapping or stacked relation in other portions thereof.

Also, the second cladding layer (over cladding layer) 8 is formed in the aforementioned preferred embodiments, but need not be formed in some cases.

Next, inventive examples of the present invention will be described in conjunction with a comparative example. It should be noted that the present invention is not limited to the inventive examples.

EXAMPLES

Inventive Examples 1 to 5

The opto-electric hybrid boards in the first to fifth preferred embodiments (with reference to FIG. 1 and FIGS. 3 to 6) were prepared as opto-electric hybrid boards in Inventive Examples 1 to 5. Each of the opto-electric hybrid boards in Inventive Examples 1 to 5 included: an insulative layer which was a transparent polyimide film having a thickness of 5 μm; electrical interconnect lines which were copper interconnect lines formed by an additive process and having a thickness of 5 μm; and a coverlay made of polyimide and having a thickness of 5 μm (as measured from the top surface of the copper interconnect lines). Each of the opto-electric hybrid boards in Inventive Examples 1 to 5 further included: a first cladding layer made of an epoxy resin, formed by a photolithographic process and having a thickness of 20 μm; cores made of an epoxy resin, formed by a photolithographic process and having a thickness of 50 μm; and a second cladding layer made of an epoxy resin, formed by a photolithographic process and having a thickness of 10 μm (as measured from the cores).

Comparative Example

Figure 7:
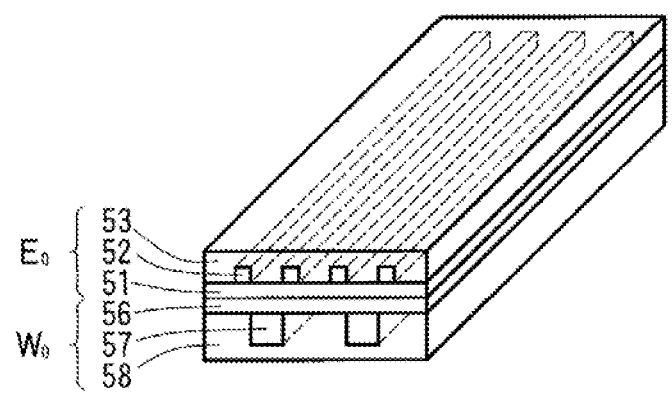
FIG. 7 is a perspective view schematically showing a conventional opto-electric hybrid board.
Figure 8:
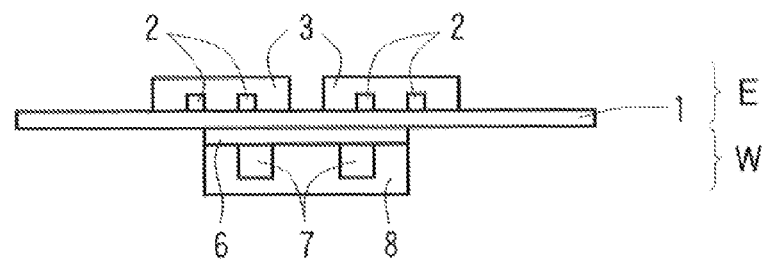
FIG. 8 illustrates a portion other than the to-be-bent portion of the embodiment illustrated in FIGS. 1 and 2.
Figure 9:
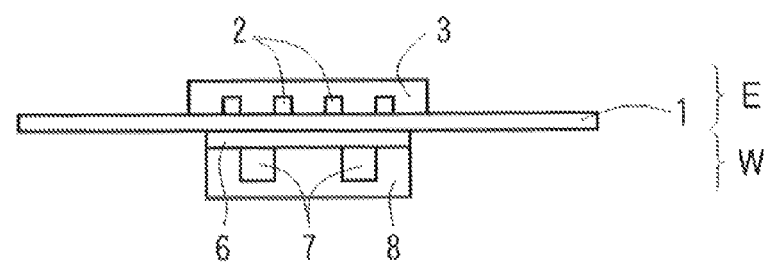
FIG. 9 illustrates a portion other than the to-be-bent portion of the embodiment illustrated in FIG. 3.
Figure 10:
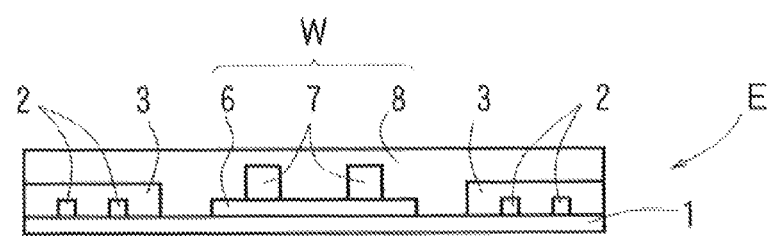
FIG. 10 illustrates a portion other than the to-be-bent portion of the embodiment illustrated in FIG. 4.
Figure 11:
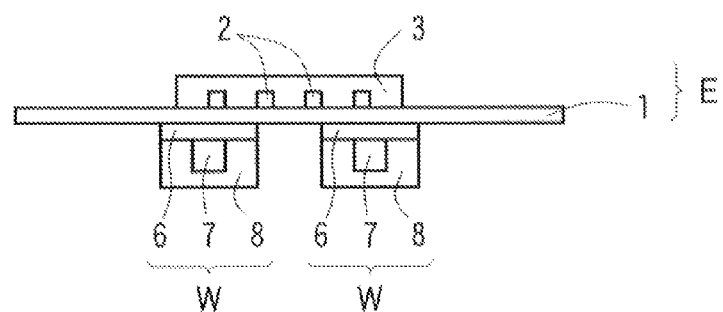
FIG. 11 illustrates a portion other than the to-be-bent portion of the embodiment illustrated in FIG. 5.
Figure 12:
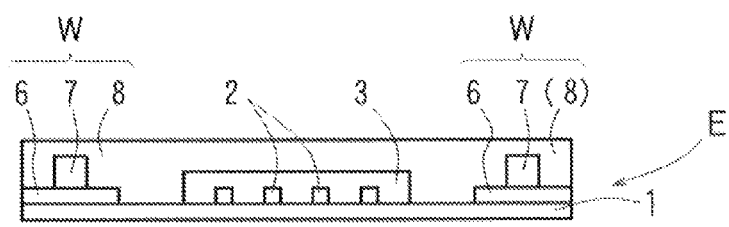
FIG. 12 illustrates a portion other than the to-be-bent portion of the embodiment illustrated in FIG. 6.

An opto-electric hybrid board in Comparative Example included a coverlay and an optical waveguide which were disposed in stacked relation (with reference to FIG. 7). The insulative layer and other components in the opto-electric hybrid board in Comparative Example had thicknesses equal to those in Inventive Examples 1 to 5 described above.

<Bending Test>

Each of the opto-electric hybrid boards in Inventive Examples 1 to 5 and Comparative Example was bent so that the optical waveguide faced inward, and first and second longitudinal ends of each opto-electric hybrid board were brought into face-to-face relation. In that state, each opto-electric hybrid board was set in a slide test machine. Then, the first and second longitudinal ends were repeatedly reciprocated so as to slide in opposite directions from each other. Each opto-electric hybrid board in such a bent position had a gap of 2 mm, and the slide stroke was 20 mm. Then, the number of reciprocations was counted until a break occurred in each opto-electric hybrid board. The results were as follows: no breaks occurred after ten thousand reciprocations in Inventive Examples 1 to 5, whereas a break occurred after 350 reciprocations in Comparative Example.

The aforementioned results show that Inventive Examples 1 to 5 in which the coverlay and the optical waveguide are in non-overlapping relation significantly reduce stresses applied to the bent portion, as compared with Comparative Example in which the coverlay and the optical waveguide are in stacked relation.

Although each opto-electric hybrid board was bent so that the optical waveguide faced inward in the aforementioned bending test, results similar to those described above were obtained when each opto-electric hybrid board was bent so that the optical waveguide faced outward.

The opto-electric hybrid board according to the present invention is usable in instances where it is used in a bent position.

Although a specific form of embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

What is claimed is:

1. An opto-electric hybrid board, comprising:
an electric circuit board including an insulative layer having front and back surfaces, electrical interconnect lines formed on the front surface of the insulative layer, and an insulative interconnect line cover layer formed on the front surface of the insulative layer and for covering and protecting the electrical interconnect lines; and
an optical waveguide including a cladding layer having a front surface, and cores formed in a pattern on the front surface of the cladding layer,
wherein the electric circuit board and the optical waveguide are stacked together, with the cladding layer being in direct contact with the back surface of the insulative layer,
wherein part of the opto-electric hybrid board is defined as a to-be-bent portion in which the interconnect line cover layer and the optical waveguide are disposed in non-overlapping relation, and
wherein the interconnect line cover layer and the optical waveguide are disposed in overlapping relation in portions other than the to-be-bent portion.

2. The opto-electric hybrid board according to claim 1, wherein $T_A$, which is the thickness of a bent portion of the opto-electric hybrid board when in a bent position, $T_E$, which is the thickness of the electric circuit board, and $T_W$, which is the thickness of the optical waveguide, satisfies the following condition:

$$T_A < T_E + T_W.$$

3. An opto-electric hybrid board, comprising:
an electric circuit board including an insulative layer having front and back surfaces, electrical interconnect lines formed on the front surface of the insulative layer, and an insulative interconnect line cover layer formed on the front surface of the insulative layer and for covering and protecting the electrical interconnect lines; and
an optical waveguide including a cladding layer having a front surface, and cores formed in a pattern on the front surface of the cladding layer,
wherein the electric circuit board and the optical waveguide are stacked together, with the cladding layer being in direct contact with the front surface of the insulative layer,
wherein part of the opto-electric hybrid board is defined as a to-be-bent portion in which the interconnect line cover layer and the optical waveguide are disposed in non-overlapping relation, and
wherein the interconnect line cover layer and the optical waveguide are disposed in overlapping relation in portions other than the to-be-bent portion.

4. The opto-electric hybrid board according to claim 3, wherein $T_A$, which is the thickness of a bent portion of the opto-electric hybrid board when in a bent position, $T_E$, which is the thickness of the electric circuit board, and $T_W$, which is the thickness of the optical waveguide, satisfies the following condition:

$$T_A < T_E + T_W.$$

* * * * *